(12) United States Patent
Sarma et al.

(10) Patent No.: US 7,574,793 B2
(45) Date of Patent: Aug. 18, 2009

(54) PROCESS OF FORMING A LAMINATE CERAMIC CIRCUIT BOARD

(75) Inventors: Dwadasi Hare Rama Sarma, Kokomo, IN (US); Rhonda Jean Heytens, Kokomo, IN (US); Carl William Berlin, West Lafayette, IN (US); Manuel Ray Fairchild, Kokomo, IN (US); Bruce Alan Myers, Kokomo, IN (US); Daniel Keith Ward, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/973,842

(22) Filed: Oct. 9, 2007

(65) Prior Publication Data

US 2008/0047136 A1 Feb. 28, 2008

Related U.S. Application Data

(62) Division of application No. 10/709,209, filed on Apr. 21, 2004, now Pat. No. 7,321,098.

(51) Int. Cl.
*K05K 3/30* (2006.01)

(52) U.S. Cl. .............................. 29/832; 29/830; 29/852; 257/706

(58) Field of Classification Search ........... 29/830–832, 29/846, 848, 851, 852; 174/255, 256, 260–262; 257/705, 706; 361/764, 783, 792–795
See application file for complete search history.

(56) References Cited

U.S. PATENT DOCUMENTS

| | | | | |
|---|---|---|---|---|
| 5,386,339 | A * | 1/1995 | Polinski, Sr. | 361/795 |
| 6,205,032 | B1 * | 3/2001 | Shepherd | 174/255 |
| 6,690,583 | B1 * | 2/2004 | Bergstedt et al. | 361/764 |

\* cited by examiner

*Primary Examiner*—Donghai D. Nguyen
(74) *Attorney, Agent, or Firm*—Jimmy L. Funke

(57) ABSTRACT

A circuit board assembly that makes use of a low-temperature co-fired ceramic (LTCC) substrate, and a process for producing the assembly. The substrate contains at least first and second regions formed by a plurality of first ceramic layers and at least one second ceramic layer, respectively, that are superimposed and bonded to each other. Conductor lines are present on at least some of the first ceramic layers so as to be between adjacent pairs of the layers. Electrically-conductive vias electrically interconnect the conductor lines on different first ceramic layers, and a surface-mount IC device is mounted to the substrate. The first ceramic layers are formed of electrically-nonconductive materials, while the one or more second ceramic layers contain thermally-conductive particles dispersed in a matrix of electrically-nonconductive materials, such that the one or more second ceramic layers are more thermally conductive than the first ceramic layers.

12 Claims, 4 Drawing Sheets and thermal management of power circuit devices.
PROCESS OF FORMING A LAMINATE CERAMIC CIRCUIT BOARD This application is a divisional of U.S. patent application Ser. No. 10/709,209, filed 21 Apr. 2004, entitled "Laminate Ceramic Circuit Board and Process There", issued as U.S. Pat. No. 7,321,098, granted 22 Jan. 2008, owned by a common assignee of interest.

BACKGROUND OF THE INVENTION (1) Field of the Invention

The present invention generally relates to substrate materials and processes suitable for use in electronic systems. More particularly, this invention relates to a laminate-type ceramic circuit board structure with enhanced mechanical and thermal properties for purposes of improved robustness and thermal management of power circuit devices.

(2) Description of the Related Art

A variety of approaches are known for dissipating heat generated by semiconductor devices, such as integrated circuit (IC) chips. One method is to use a flex circuit laminated or bonded to heat sink. If the flex circuit material is sufficiently thin, this approach can employ a highly conductive path formed by plated vias through the flex circuit to the heat sink. Another method is to equip a printed circuit board (PCB) with an innerlayer heat sink that is the same size or are larger than the PCB to provide a large heat sink for the entire board, and rely on conduction through the PCB material to the heat sink beneath. High-power IC chips, such as power flip chips, are often mounted to substrates formed of ceramic materials such as alumina ($Al_2O_3$) or another ceramic material that may be modified to promote its heat conduction capability. Ceramic substrates, which conduct and dissipate heat in the vertical direction away from the chip, are limited in their ability to dissipate heat laterally because the thermal conductivities of ceramic materials are relatively low compared to metals and metal-containing materials, though relatively high compared to PCB's.

Laminate-type ceramic substrates known as low temperature co-fired ceramics (LTCC) have a number of process-related advantages that result from their laminate construction. LTCC substrates are conventionally made up of multiple green tapes that are collated (stacked), laminated and fired (co-fired) to form a monolithic ceramic substrate. LTCC substrates have been formed entirely of green tapes that contain glass mixed with a metal powder. For example, U.S. Pat. No. 6,690,583 to Bergstedt et al. discloses a thermally conductive LTCC substrate formed to have surface cavities in which circuit devices are contained. Electrical connections are then made to the devices by depositing a dielectric layer over the LTCC substrate and the devices within its cavities, and then forming contacts through the dielectric layer to the devices. In this manner, heat is conducted away from the devices through the thermally-conductive LTCC on which they are mounted.

In other applications where individual layers of an LTCC substrate are to carry conductor patterns, resistors, etc., ceramic layers are formed by firing green tapes containing only a mixture of glass and ceramic fillers in a binder. Thick-film conductors, resistors, etc., are printed on individual tapes prior to collating and laminating the tapes. The tapes, along with their conductors and resistors, are then co-fired, during which organic binders within the laminate stack are burned off and the remaining materials form, according to their compositions, ceramic and metallic materials. Though LTCC substrates of this type have a number of process-related advantages resulting from their laminate construction, they typically have about half the mechanical strength of a comparable alumina substrate and thermal conductivities of about 3 W/mK, compared to about 24 W/mK for alumina. Mechanical strength can be improved by providing "dummy" glass dielectric layers within the laminate stack, resulting in a thicker, more robust LTCC substrate. Improvements in thermal conductivity have been obtained with the use of thermal vias. As represented in FIG. 1, this approach involves forming multiple vias 114 through the thickness of an LTCC substrate 110 to conduct heat in a vertical direction from a power chip 112. The thermal vias 114 are formed by punching vias in each green tape and then filling the vias prior to printing the conductors, resistors, etc. Interconnect vias 116 required for the LTCC substrate 110 can be formed and filled at the same time as the thermal vias 114. The tapes are then laminated so that the filled vias are aligned to form through-vias, after which the tapes are fired such that the via fill material is co-fired along with conductor and resistor materials printed on surfaces of individual tapes. The entire LTCC substrate 110 is then bonded with an adhesive 118 to a heat sink 120 so that the thermal vias 114 conduct heat from the chip 112 to the heat sink 120.

While able to promote the conduction of heat away from power devices, thermal vias incur additional processing and material costs, reduce routing density, and can limit design flexibility. Furthermore, the thermal vias may be inadequate to achieve suitable thermal management of the power device. Alternatives to conventional filled thermal vias have been proposed. For example, U.S. Pat. No. 5,386,339 to Polinski, Sr., discloses making a thermally conductive path through an otherwise conventional LTCC by defining a hole in the LTCC that is filled with a number of LTCC green tapes containing a thermally conductive material, such as a metal powder dispersed in the mixture of glass and ceramic fillers. On firing, the tapes form an LTCC substrate in which a vertical thermally-conductive path is formed by the tapes containing the conductive material.

Notwithstanding the above, further improvements in the construction and processing of LTCC substrates would be desirable to improve thermal management of power IC's while retaining the process-related advantages of LTCC's.

BRIEF SUMMARY OF THE INVENTION

The present invention provides a laminate circuit board assembly that makes use of a LTCC ceramic substrate, and a process for producing such an assembly. The substrate has enhanced thermal properties for purposes of improved thermal management of power circuit devices while retaining the process-related advantages of LTCC substrates. Substrates of this invention are also capable of exhibiting enhanced mechanical properties for improved robustness.

According to a first aspect of the invention, the substrate comprises at least first and second regions superimposed and bonded to each other. The first region is formed of first ceramic layers that are superimposed and consist essentially of electrically-nonconductive materials. At least some of the first ceramic layers are bonded to each other. The second region is formed of at least one second ceramic layer containing thermally-conductive particles dispersed in a matrix comprising electrically-nonconductive materials. The thermally-conductive particles have a higher coefficient of thermal conductivity than the electrically-nonconductive materials of the first and second ceramic layers. Conductor lines are present on at least some of the first ceramic layers so as to be between adjacent pairs of the first ceramic layers, and electrically-conductive vias electrically interconnect the conductor lines on different first ceramic layers. Finally, a surface-mount IC device is mounted to a first surface of the substrate defined by one of the first ceramic layers, so that heat is conducted through the first ceramic layers to the second ceramic layers.

The process of the present invention generally entails providing first and second pluralities of green tapes that will subsequently form the first and second ceramic layers of the substrate. As such, the first plurality of green tapes consist essentially of electrically-nonconductive materials in a binder, and the second plurality of green tapes contain thermally-conductive particles dispersed in a matrix comprising electrically-nonconductive materials and a binder. Vias are formed through each of the first plurality of green tapes, after which an electrically-conductive material is deposited within the vias. Electrical conductor lines are also deposited on surfaces of the first plurality of green tapes. The green tapes are then collated and laminated together to form a green substrate. Co-firing of the green substrate yields a co-fired ceramic substrate, in which the first and second ceramic layers are superimposed and bonded to each other, the conductor lines are between adjacent pairs of the first ceramic layers, and the electrically-conductive vias electrically interconnect the conductor lines on different first ceramic layers. Finally, a surface-mount IC device is mounted to a first surface of the substrate defined by one of the first ceramic layers.

According to the invention, the LTCC ceramic substrate described above does not require thermal vias that extend through the substrate from the surface-mount device to an oppositely-disposed second surface of the substrate. Instead, thermal management can be achieved with the second plurality of ceramic layers, whose thermal conductivity is enhanced by the presence of the thermally-conductive particles. The thermal conductivity of the second plurality of ceramic layers can be readily adjusted as needed by the number, locations, and thicknesses of the second plurality of ceramic layers relative to the number, locations, and thicknesses of the first plurality of ceramic layers. For example, with appropriate amounts of the thermally-conductive particles in combination with the electrically-nonconductive materials, the thermal conductivity of the second plurality of ceramic layers can be twice that of the first plurality of ceramic layers. By eliminating the requirement for thermal vias, routing density of the conductor lines is not compromised.

Properties such as mechanical strength of the substrate and the coefficient of thermal expansion of the substrate portion formed by the second plurality of ceramic layers can also be adjusted by the choice of thermally-conductive particles and the relative amounts of thermally-conductive particles and electrically-nonconductive materials used to form the second plurality of ceramic layers.

The above advantages of the invention can be achieved without changing any of the fundamental steps of the LTCC process. As such, the processing and structural advantages of LTCC substrates, including the ability to produce conductor lines and other circuit components by photoimaging techniques, can be retained by the invention.

Other objects and advantages of this invention will be better appreciated from the following detailed description.

DETAILED DESCRIPTION OF THE INVENTION

Figure 2:
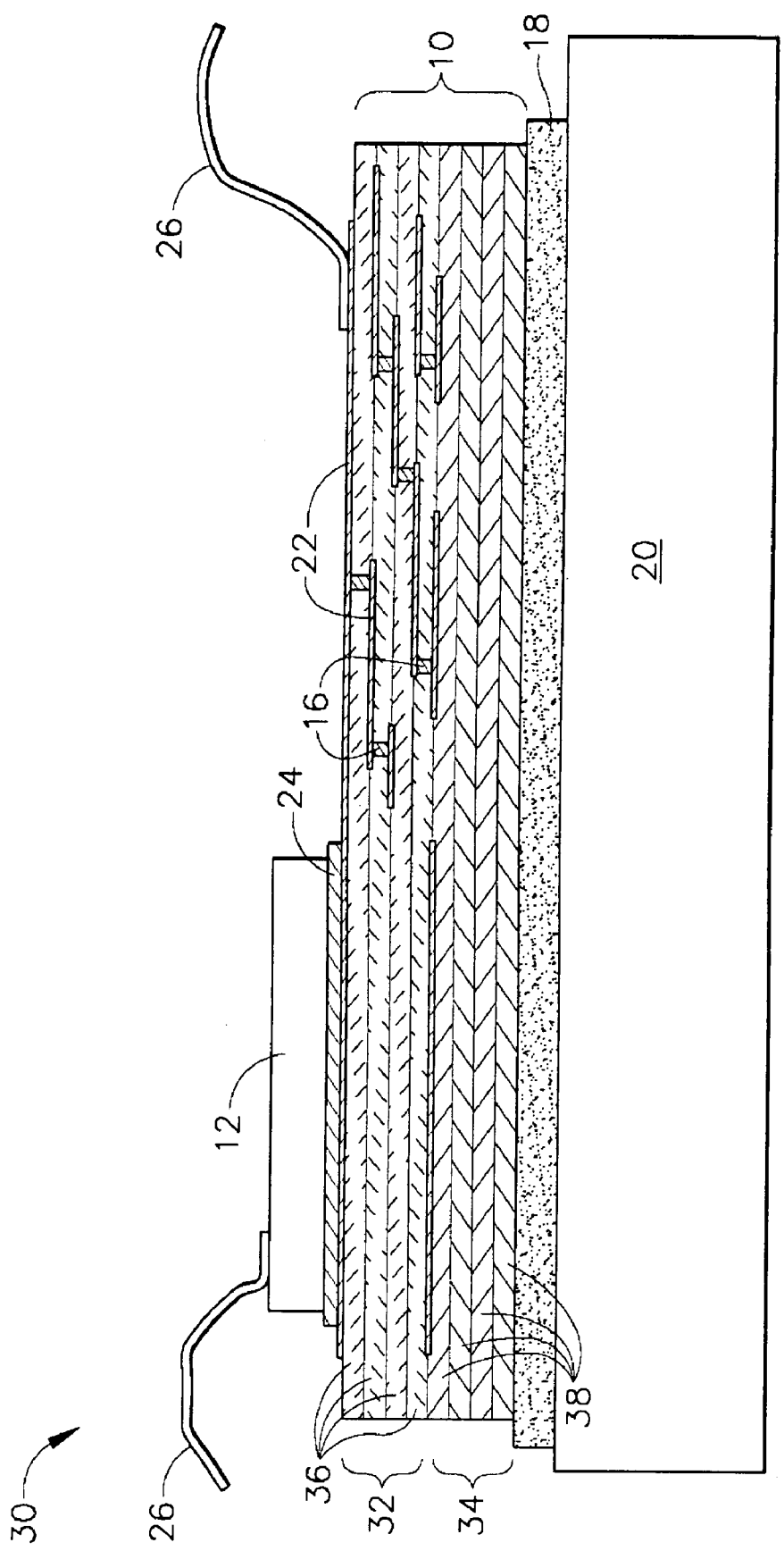
FIGS. 2 and 3 show LTCC substrates in accordance with two embodiments of the present invention.

FIG. 2 depicts a circuit board assembly 30 in which a power chip 12 is mounted to a surface of a low-temperature co-fired ceramic (LTCC) substrate 10 in accordance with the present invention. As an LTCC, the substrate 10 is a monolithic structure made up of multiple ceramic layers 36 and 38 bonded to each other, with thick-film conductors 22 located within the substrate 10 as a result of being formed on individual green tapes that, after stacking and firing at a temperature of up to about 900° C., form the ceramic layers 32. Also consistent with LTCC substrates of the past, conductors 22 on adjacent layers 36 are electrically interconnected with conductive interconnect vias 16. The vias 16 are preferably filled through-holes, in which holes having a diameter of about 3 to about 20 mils (about 75 to about 500 micrometers) are formed and filled with a suitable conductive material prior to stacking and firing the green tapes, as will be discussed in greater detail below with reference to FIG. 4.

Figure 1:
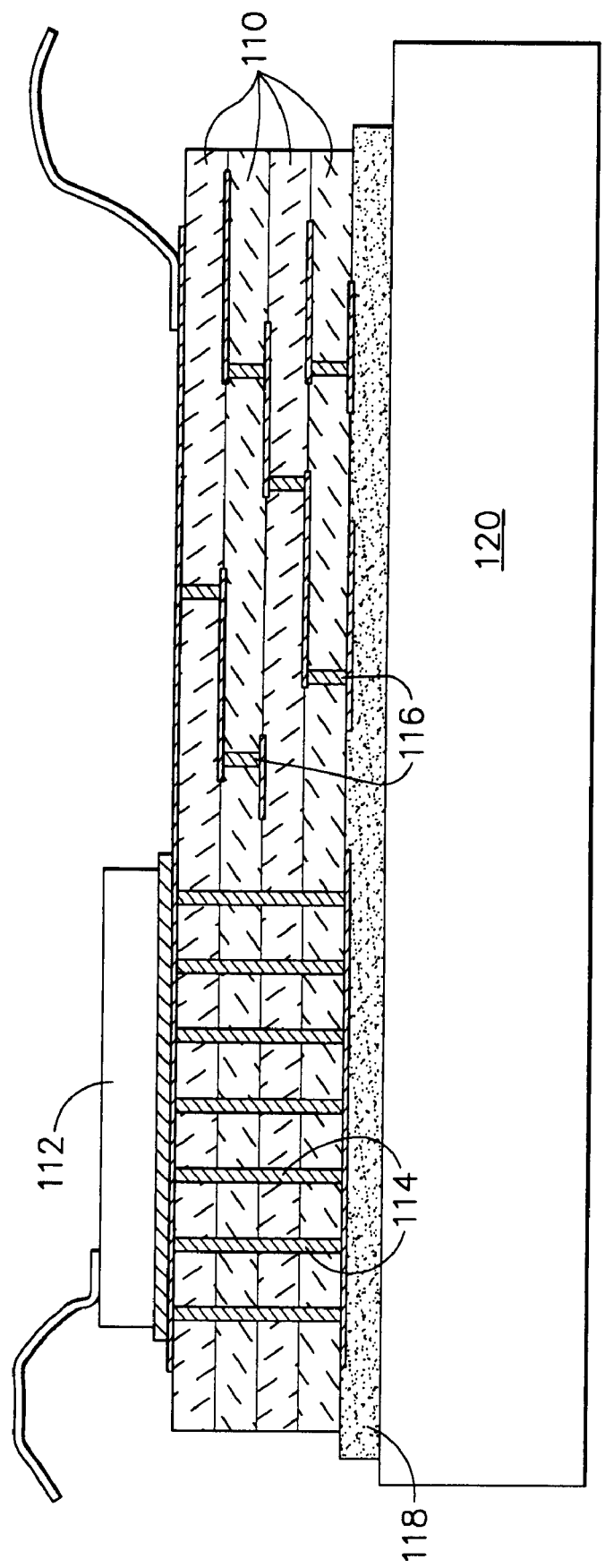
FIG. 1 shows an LTCC substrate with thermal vias in accordance with the prior art.

The chip 12 is shown as being bonded with solder 24 to one of the conductors 22 on the substrate 10, though it is foreseeable that other suitable chip configurations and attachment techniques could be used. Electrical connection to the chip 12 is shown as also being made with a wire bond interconnect 26, though other possibilities are also within the scope of this invention. As with prior art LTCC substrates (e.g., FIG. 1), heat dissipated by the chip 12 is conducted away from the chip 12 through the substrate 10 to a heat sink 20 to which the substrate 10 is bonded with an adhesive 18. Preferred materials for the heat sink 20 include aluminum and its alloys and copper and its alloys, though other materials could be used.

According to the embodiment of FIG. 2, heat is not conducted through the substrate 10 with thermal vias that extend through the thickness of the substrate 10. Instead, the conduction of heat through the substrate 10 is promoted by the formulation of, in the embodiment shown, the lower ceramic layers 38 of the substrate 10. More particularly, the ceramic layers 38 are formulated to have a thermally-conductive additive that is preferably not present in the upper ceramic layers 36. In the embodiment shown, the lower ceramic layers 38 are bonded surface-to-surface to define a continuous region 34 of the substrate 10 with higher thermal conductivity than the remainder of the substrate 10, which is also a continuous region 32 as a result of being defined by the ceramic layers 36 bonded surface-to-surface. Alternatively, it is foreseeable that some of the ceramic layers 36 could be located between some of the ceramic layers 36. In any event, heat generated by the chip 12 is conducted through one or more of the ceramic layers 36 forming the upper surface of the substrate 10, with conduction through the remainder of the substrate 10 and into the heat sink 20 being promoted by the presence of the ceramic layers 38 containing the thermally-conductive additive.

As with prior art LTCC substrates, each of the ceramic layers 36 and 38 preferably contains a mixture of electrically-nonconductive materials, typically glass and ceramic particles that, when fired, fuse to form a rigid monolithic structure. The thermally-conductive additive contained by the ceramic layers 38 are preferably particles having a higher coefficient of thermal conductivity than the electrically-nonconductive materials of the ceramic layers 36 and 38, resulting in the ceramic layers 38 being more thermally conductive than the ceramic layers 36. Suitable fired compositions for the ceramic layers 36 include, by weight, about 30% to about 100% of a glass frit material such as BaO—CaO—SiO$_2$—Al$_2$O$_3$—TiO$_2$, with the balance being essentially a ceramic material such as Al$_2$O$_3$. In contrast, suitable fired compositions for the ceramic layers 38 include, by weight, about 10% to about 95% thermally-conductive particles, with the balance being a glass frit material such as PbO—MnO—VO$_2$—CuO—SiO$_2$—B$_2$O$_3$, and optionally up to about 85% of a ceramic material such as mullite (3Al$_2$O$_3$.2SiO$_2$). Suitable materials for the thermally-conductive particles include metals such as Ag, Cu, Pt, Pd, Ni, W, Mo, Au, and combinations thereof, and non-metallic materials such as aluminum nitride AlN, SiN, BN, SiC, BeO, Al$_2$O$_3$ and other high performance ceramic carbides, nitrides and borides. The thermally-conductive particles preferably result in the ceramic layers 38 having thermal conductivities of at least 10 W/mK. For example, in one formulation the ceramic layers 38 contain about 58 weight percent silver particles having an particle size of about 0.1 to about 10 micrometers, and about 42 weight percent of a glass frit mixture such as BaO—CaO—SiO$_2$—Al$_2$O$_3$—TiO$_2$. Ceramic layers 38 with this composition have thermal conductivities of about 244 W/mK, as compared to about 3 W/mK for conventional LTCC substrate materials. Furthermore, such ceramic layers 38 have coefficients of thermal expansion (CTE) of about 11 ppm/° C., as compared to about 7 ppm/° C. typical for LTCC substrates of the prior art. As such, the ceramic layers 38 have a CTE of within about 4 ppm/° C. (roughly about 50%) of the ceramic layers 36. This is a much superior CTE match with LTCC layers than afforded by layers of 100% metal such as Cu, which has a CTE of about 17 ppm/° C.

Figure 4:
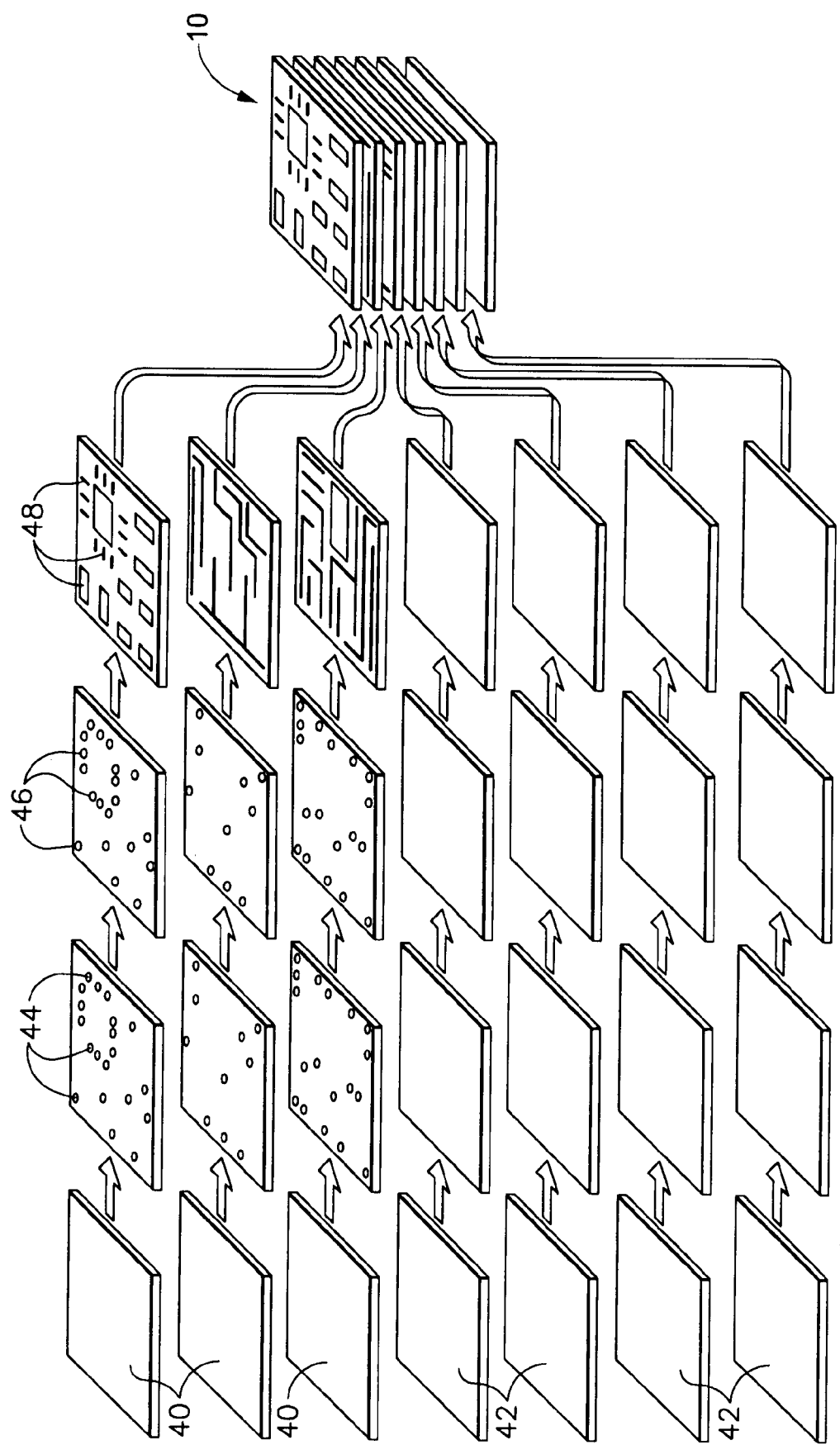
FIG. 4 schematically represents processing steps for producing an LTCC substrate of the type shown in FIG. 2.

FIG. 4 represents processing steps entailed in the fabrication of the substrate 10 shown in FIG. 2. According to a preferred aspect of the invention, the process of making the substrate 10 can be achieved without changing any of the fundamental steps of a conventional LTCC process. As such, the process of this invention will not be described in any great detail except where necessary to distinguish the process from prior practices.

The process depicted in FIG. 4 generally begins with green ceramic tape rolls (not shown) from which individual green tapes 40 and 42 are blanked. The green tapes 40 and 42 are formulated to contain a binder along with the appropriate glass frit, ceramic and/or thermally-conductive materials so that, when fired, they will yield the desired compositions for the ceramic layers 36 and 38 of the substrate 10. Following blanking, the green tapes 40 that will form the ceramic layers 36 undergoing via punching to yield through-hole vias 44 where interlayer connections will be required within the substrate 10. The vias 44 are then filled with a suitable conductive paste, which on firing will yield the electrically-conductive filled vias 16 of FIG. 2. Thereafter, conductive paste 48 is printed on the green tapes 40 to form, on firing, the thick-film conductors 22 of FIG. 2, as well as any thick-film resistors, etc., required for the circuit.

Conventional LTCC processing can then be performed, including collating and laminating the tapes 40 and 42, so that the tapes 40 and 42 are superimposed, i.e., the edges of the tapes 40 and 42 are aligned. The resulting green substrate is then co-fired, during which the binders within the tapes 40 and 42 and their components (e.g., vias 46 and conductors 48) are burned off and the remaining inorganic components are fused. Finally, such conventional post-printing and post-firing process steps as resistor trimming and electrical testing are carried out before singulation and final inspection.

Figure 3:
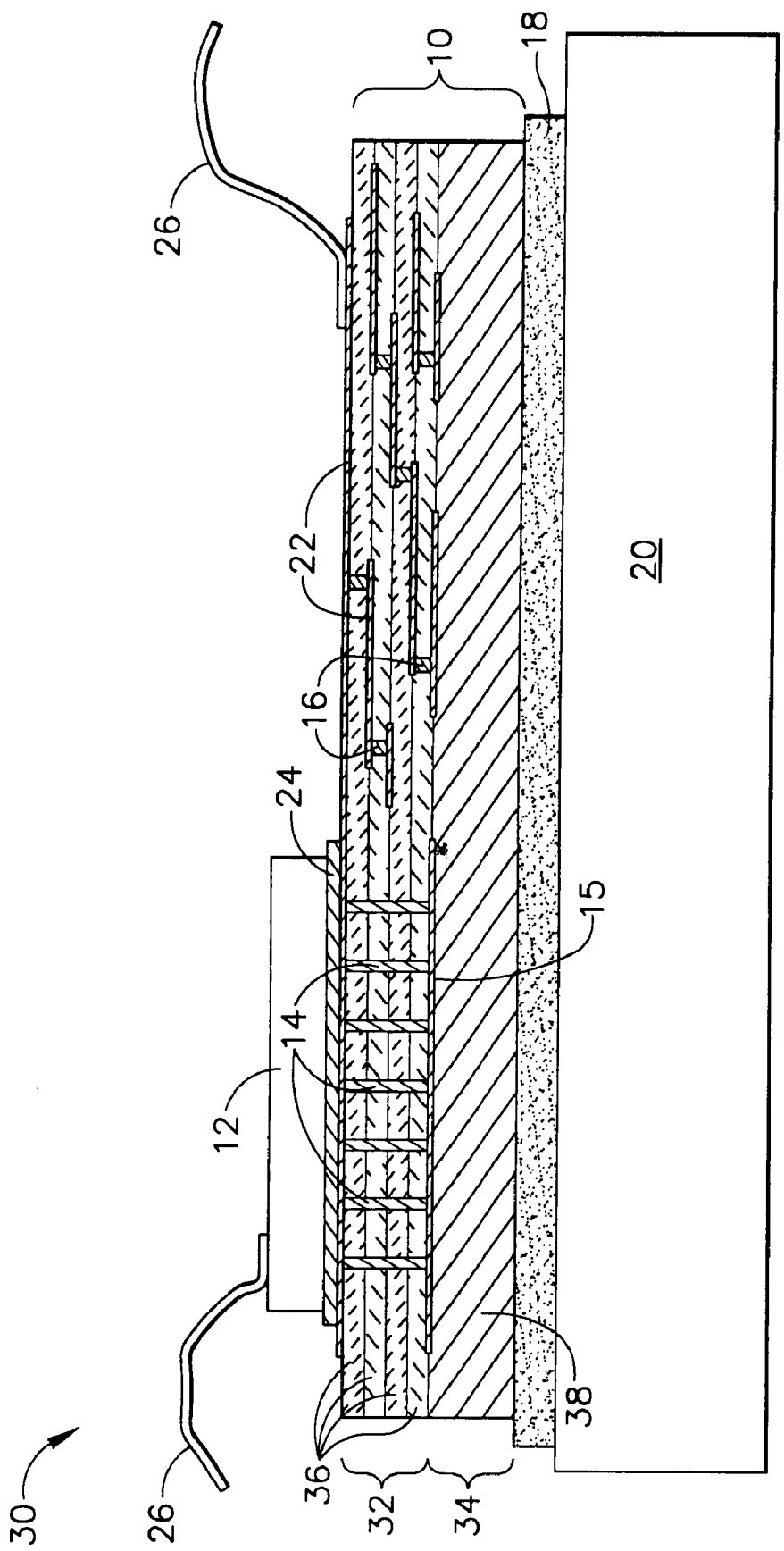

FIG. 3 represents an alternative embodiment of the invention, in which further improvements in thermal conductivity are obtained with the use of thermal vias 14. For convenience, the same reference numbers are used in FIG. 3 to identify features and structures equivalent to those shown in FIG. 2. As evident from FIG. 3, the thermal vias 14 do not extend entirely through the LTCC substrate 10 of the circuit board assembly 30, but instead extend only through the ceramic layers 36 that make up the upper continuous region 32 of the substrate 10. The substrate 10 is shown to further include a metal layer 15 between the continuous regions 32 and 34, to which the vias 14 conduct heat from the power chip 12. The metal layer 15 can be formed of a thick-film conductor material, and therefore formed simultaneously with the thick-film conductors 22 located within the substrate 10. Finally, in place of the multiple ceramic layers 38 that make of the lower continuous region 34 represented in FIG. 2, the embodiment of FIG. 3 makes use of a single thicker ceramic layer 38 to form the lower continuous region 34 of the substrate 10. As with the embodiment of FIG. 2, only the ceramic layer 38 is modified to contain a thermally-conductive additive, such that the continuous region 34 has a higher coefficient of thermal conductivity than the continuous region 32.

The thermal vias 14 can be formed in the green tapes (e.g., 40 in FIG. 4) that will form the ceramic layers 36 in the same manner as the interconnect vias 16. After laminating and firing the tapes to form the LTCC substrate 10, the entire substrate 10 is bonded with an adhesive 18 to a heat sink 20 so that heat is conducted from the chip 12 through the thermal vias 14 to the metal layer 15. The metal layer 15 acts to laterally spread the heat before being conducted down through the ceramic layer 38 to the heat sink 20.

While the invention has been described in terms of a preferred embodiment, it is apparent that other forms could be adopted by one skilled in the art. Accordingly, the scope of the invention is to be limited only by the following claims.

The invention claimed is:

1. A process of forming a circuit board assembly, the process comprising the steps of:

providing green tapes of which at least a first plurality thereof consist essentially of low thermal conductivity, electrically-nonconductive materials in a binder and of which at least a second plurality thereof contains thermally-conductive particles dispersed in a matrix comprising electrically-nonconductive materials and a binder, the thermally-conductive particles having a higher coefficient of thermal conductivity than the electrically-nonconductive materials of the green tapes;

forming vias through at least some of the first plurality of the green tapes;

depositing an electrically-conductive material within the vias and depositing an electrically-conductive material on surfaces of the first plurality of the green tapes;

collating and laminating the green tapes together to form a green substrate;

co-firing the green substrate to form a co-fired substrate comprising at least first and second regions superimposed and bonded to each other, the first region comprising first ceramic layers that are superimposed and formed by the first plurality of the green tapes, the second region comprising a second ceramic layer formed by the second green tape, at least some of the first ceramic layers of the first region being bonded to each other, the electrically-conductive material on the surfaces of the first plurality of the green tapes forming conductor lines between adjacent pairs of the first ceramic layers, the vias filled with the electrically-conductive material forming electrically-conductive vias that electrically interconnect the conductor lines on the first ceramic layers; and then mounting a surface-mount integrated circuit (IC) device to a first surface of the substrate defined by one of the first ceramic layers.

2. A process according to claim 1, wherein the green substrate is co-fired at a temperature of about 900° C.

3. A process according to claim 1, wherein the thermally-conductive particles are metal and/or ceramic particles.

4. A process according to claim 1 wherein, as a result of the collating, laminating and co-firing steps, the substrate does not contain any thermal vias extending through the substrate from the surface-mount device on the first surface to an oppositely-disposed second surface of the substrate.

5. A process according to claim 1, further comprising steps of:
    forming second vias through the first plurality of the green tapes; and
    depositing a thermally-conductive material within the second vias;
    wherein as a result of the collating and laminating step the second vies are aligned and as a result of the co-firing step the substrate contains thermal vies that extend from the surface-mount device on the first surface to but not into the second region of the substrate.

6. A process according to claim 1, wherein the second ceramic layer has a thermal conductivity of at least 10 W/mK.

7. A process according to claim 1, wherein the second ceramic layer has a coefficient of thermal expansion of within about 4 ppm/° C. of the first ceramic layers.

8. A process according to claim 1 wherein the green tapes comprise a plurality of second green tapes containing thermally-conductive particles dispersed in a matrix comprising electrically-nonconductive materials and a binder.

9. A process according to claim 8 wherein, as a result of the collating, laminating and co-firing steps, the second green tapes form second ceramic layers that are bonded surface-to-surface to form the second region of the substrate, the second region is free of the first ceramic layers, the first ceramic layers are bonded surface-to-surface to form the first region of the substrate, and the first region is free of the second ceramic layers.

10. A process of forming a circuit board assembly, the process comprising:
    providing a plurality of green tapes, at least a first plurality of the green tapes consisting essentially of low thermal conductivity, electrically-nonconductive glass and ceramic materials in a binder, at least a second plurality of the green tapes containing thermally-conductive particles dispersed in a matrix comprising electrically-nonconductive glass and ceramic materials and a binder, the thermally-conductive particles having a higher coefficient of thermal conductivity than the electrically-nonconductive materials of the first and second pluralities of green tapes;
    forming vias trough at least some of the first plurality of green tapes but not through any of the second plurality of green tapes;
    depositing an electrically-conductive material within the vias and depositing an electrically-conductive material on surfaces of the first plurality of green tapes;
    collating and laminating the plurality of green tapes together to form a green substrate in which the first plurality of green tapes are collated and laminated to be surface-to-surface to form a first region of the green substrate that is free of the second plurality of the green tapes and the second plurality of the green tapes are collated and laminated to be surface-to-surface to form a second region of the green substrate that is free of the first plurality of the green tapes;
    co-firing the green substrate at a temperature of about 900° C. to form a co-fired substrate comprising first and second regions superimposed and bonded to each other, the first region being formed by the first region of the green substrate so as to contain first ceramic layers that are superimposed, bonded to each, and formed by the first plurality of the green tapes, the second region being formed by the second region of the green substrate so as to contain second ceramic layers that are superimposed, bonded to each, and formed by the second plurality of the green tapes, the electrically-conductive material on the surfaces of the first plurality of the green tapes forming conductor lines between adjacent pairs of the first ceramic layers, the vias filled with the electrically-conductive material forming electrically-conductive vias that electrically interconnect the conductor lines on adjacent pairs of the first ceramic layers, the second ceramic layers having thermal conductivities of at least 10 W/mK and having coefficients of thermal expansion of within about 4 ppm/° C. of the first ceramic layers; and then
    mounting a surface-mount integrated circuit (IC) device to a first surface of the substrate defined by one of the first ceramic layers;
    wherein the substrate does not contain any thermal vias extending through the second region or the second ceramic layers.

11. A method of forming a circuit board assembly comprising the steps of:
    providing a co-fired substrate comprising at least first and second regions superimposed and bonded to each other, the first region being formed of a plurality of superimposed first ceramic layers, each first ceramic layer consisting essentially of low thermal conductivity, electrically-nonconductive materials, at least some of the first ceramic layers being bonded to each other, and the second region being formed of at least one second ceramic layer containing thermally-conductive particles dispersed in a matrix comprising electrically-nonconductive materials, the thermally-conductive particles having a higher coefficient of thermal conductivity than the electrically-nonconductive materials of the first and second ceramic layers;
    forming conductor lines on at least some of the first ceramic layers so as to be between adjacent pairs of the first ceramic layers;
    depositing electrically-conductive vias that extend through at least some of the first ceramic layers and electrically interconnect the conductor lines on the first ceramic layers; and
    mounting a surface-mount integrated circuit (IC) device mounted to a first surface of the substrate defined by one of the low thermal conductivity first ceramic layers, wherein said first and second regions are arranged for serial thermal, interconnection between said IC device and an opposed heat sink, and wherein each first ceramic layer and said at least one second ceramic layer have substantially similar width and length characteristic dimensions.

12. A method of forming a circuit board assembly comprising the steps of:
    providing a low-temperature co-fired substrate comprising first and second regions superimposed and bonded to each other, the first region being formed of a plurality of superimposed first ceramic layers that are bonded to each other, each first ceramic layer consisting essentially of low thermal conductivity electrically-nonconductive glass and ceramic materials, and the second region being formed of second ceramic layers that are superimposed, bonded to each other, and contain thermally-conductive particles dispersed in a matrix comprising electrically-nonconductive glass and ceramic materials, the thermally-conductive particles having a higher coefficient of thermal conductivity than the electrically-nonconductive glass and ceramic materials of the first and second ceramic layers, the first region of the substrate being free of the second ceramic layers and the second region of the substrate being free of the first ceramic layers and being bonded to the first region of the substrate, the second ceramic layers having thermal conductivities of at least 10 W/mK and having coefficients of thermal expansion of within about 4 ppm/° C. of the first ceramic layers;

forming conductor lines on at least some of the first ceramic layers so as to be between adjacent pain of the first ceramic layers;

depositing electrically-conductive vias that electrically interconnect the conductor lines on different first ceramic layers; and mounting a surface-mount integrated circuit (IC) device mounted to a first surface of the substrate defined by one of the low thermal conductivity, first ceramic layers, wherein the substrate does not contain any thermal vias extending through the second region or the second ceramic layers, wherein said first and second regions are arranged for serial thermal interconnection between said IC device and an opposed heat sink, and wherein each first ceramic layer and said at least one second ceramic layer have substantially similar width and length characteristic dimensions.

* * * * *